United States Patent [19]

Paivinen

[11] Patent Number: 5,294,846
[45] Date of Patent: Mar. 15, 1994

[54] METHOD AND APPARATUS FOR PROGRAMMING ANTI-FUSE DEVICES

[75] Inventor: John O. Paivinen, San Jose, Calif
[73] Assignee: QuickLogic Corporation, Santa Clara, Calif.
[21] Appl. No.: 931,048
[22] Filed: Aug. 17, 1992
[51] Int. Cl.$^5$ ................. H03K 19/173; H03K 19/082
[52] U.S. Cl. ................... 307/465; 307/202.1
[58] Field of Search .............. 307/465, 465.1, 202.1

[56] References Cited

U.S. PATENT DOCUMENTS

| | | | |
|---|---|---|---|
| 3,629,863 | 12/1971 | Neale | 340/173 |
| 3,699,543 | 10/1972 | Neale | 340/173 R |
| 3,987,287 | 10/1976 | Cox et al. | 235/152 |
| 4,146,902 | 3/1979 | Tanimoto et al. | 357/6 |
| 4,177,475 | 12/1979 | Holmberg | 357/2 |
| 4,207,556 | 6/1980 | Sugiyama et al. | 340/166 R |
| 4,399,372 | 8/1983 | Tanimoto et al. | 307/279 |
| 4,420,766 | 12/1983 | Kasten | 357/59 |
| 4,433,331 | 2/1984 | Kollaritsch | 340/825.83 |
| 4,455,495 | 6/1984 | Masuhara et al. | 307/44 |
| 4,494,220 | 1/1985 | Dumbri et al. | 365/200 |
| 4,499,557 | 2/1985 | Holmberg et al. | |
| 4,543,594 | 9/1985 | Mohsen et al. | 357/51 |
| 4,609,986 | 9/1986 | Hartmann et al. | 364/200 |
| 4,609,998 | 9/1986 | Bosnyak et al. | 365/96 |
| 4,642,487 | 2/1987 | Carter | 307/465 |
| 4,651,409 | 3/1987 | Ellsworth et al. | 29/576 B |
| 4,670,749 | 6/1987 | Freeman | 340/825.85 |
| 4,691,161 | 9/1987 | Kant et al. | 324/73 |
| 4,749,947 | 6/1988 | Gheewala | 324/73 |
| 4,758,745 | 7/1988 | El Gamal et al. | 307/465 |
| 4,769,791 | 9/1988 | Liou et al. | 365/203 |

(List continued on next page.)

FOREIGN PATENT DOCUMENTS 0265554 5/1988 European Pat. Off. .
0365733 5/1990 European Pat. Off. .

OTHER PUBLICATIONS

IBM Technical Disclosure Bulletin, vol. 19, No. 6, Nov. 1976 pp. 2144–2145, Greenspan et al., "Program Logic Array with Metal Level Personalization".

IBM Technical Disclosure Bulletin, vol. 19, No. 7, Dec. 1976, pp. 2628–29 Conrad et al. "Programmable Logic Array with . . . ".
IBM Technical Disclosure Bulletin, vol. 23, No. 6, Nov. 1980, pp 2189–91, Greenspan et al., "Merged and/or Array PLA using . . . ".
IBM Technical Disclosure Bulletin, vol. 24, Dec. 1981, p. 3898 Askin et al, "PLA with Segmented Lines For Faster Signal Propagation".
Wilson et al. "A Four-Metal Layer, High Performance Interconnect System for Bipolar and BiCMOS Circuits", *Solid State Technology*, Nov. 1, 1991, pp. 67–71.
New York Times, "Making Designer Chips On a Desktop Setup", Aug. 11, 1991.

*Primary Examiner*—Edward P. Westin
*Assistant Examiner*—Richard Roseen
*Attorney, Agent, or Firm*—Davis Hoxie Faithfull & Hapgood

[57] ABSTRACT

Improved apparatus and methods for programming anti-fuse devices utilized in programmable semiconductor chips are described. An anti-fuse device circuit is disclosed wherein an anti-fuse device is connected between two programming transistors, and each programming transistor is connected to a separate voltage supply bus and to a control bus network having, for example, a common control bus or separate control buses. Interconnection structures of anti-fuse devices can be formed and a targeted anti-fuse device can be programmed by connecting a programming voltage to the first associated supply bus, by connecting another voltage or ground potential to the second associated supply bus, and by turning on the appropriate control bus line or lines so that the programming transistors conduct to provide a voltage differential across the targeted anti-fuse device. Several anti-fuse device interconnection embodiments are discussed, and the choice of a particular scheme to use for fabricating a programmable chip is dependent on the desired design features and on ease of software implementation.

94 Claims, 8 Drawing Sheets

U.S. PATENT DOCUMENTS

| | | | |
|---|---|---|---|
| 4,786,904 | 11/1988 | Graham, III et al. | 340/825.83 |
| 4,818,988 | 4/1989 | Cooperman et al. | 340/825.85 |
| 4,823,181 | 4/1989 | Mohsen et al. | 357/51 |
| 4,855,619 | 8/1989 | Hsieh et al. | 307/443 |
| 4,857,774 | 8/1989 | El-Ayat et al. | 307/465 |
| 4,870,302 | 9/1989 | Freeman | 307/465 |
| 4,873,459 | 10/1989 | El Gamal et al. | 307/465 |
| 4,899,205 | 2/1990 | Hamdy et al. | 357/51 |
| 4,910,417 | 3/1990 | El Gamal et al. | 307/465 |
| 4,910,418 | 3/1990 | Graham et al. | 307/465 |
| 4,924,287 | 5/1990 | Orbach | 357/51 |
| 4,943,538 | 7/1990 | Mohsen et al. | 437/52 |
| 4,949,084 | 8/1990 | Schwartz et al. | 340/825 |
| 4,963,770 | 10/1990 | Keida | 307/465 |
| 4,970,686 | 11/1990 | Naruke et al. | 365/96 |
| 4,972,105 | 11/1990 | Burton et al. | 307/468 |
| 4,996,670 | 2/1991 | Ciraula et al. | 365/200 |
| 5,003,200 | 3/1991 | Sakamoto | 307/465 |
| 5,008,855 | 4/1991 | Eltoukhy et al. | 365/96 |
| 5,015,885 | 5/1991 | El Gamal et al. | 307/465 |
| 5,027,012 | 6/1991 | Saeki et al. | 307/465 |
| 5,049,969 | 9/1991 | Orbbach et al. | 357/51 |
| 5,099,149 | 3/1992 | Smith | 307/465 |
| 5,194,759 | 3/1993 | El-Agat et al. | 307/465 |
| 5,200,652 | 4/1993 | Lee | 307/465 |
| 5,223,792 | 6/1993 | El-Ayat et al. | 307/465 |

METHOD AND APPARATUS FOR PROGRAMMING ANTI-FUSE DEVICES

FIELD OF THE INVENTION

The present invention relates to programmable semiconductor chip technology. More specifically, the present invention pertains to circuitry and methods for programming interconnection structures of anti-fuse devices.

BACKGROUND

Most commercial integrated circuits ("chips") have predetermined logic functions which are established by the manufacturer. Programmable logic semiconductor device chips (hereinafter "programmable chips") are a class of integrated circuits that can be modified by an end user to achieve synthesis of arbitrary logic that is selected by the user.

Anti-fuse devices have proven to be useful for interconnecting elements of such programmable chips. An anti-fuse device is a circuit element which is normally non-conducting. It becomes a low impedance conductor when its state is changed by a programming action. A programming action is defined as the application of a voltage above a predetermined threshold level to an anti-fuse device. Anti-fuse devices are used to establish the interconnecting paths for signals between standardized functional logic blocks or other elements of the programmable chip.

User-programmable array logic circuits using anti-fuse devices to implement arbitrary logic functions are known. One prior art method, disclosed in U.S. Pat. No. 4,758,745, uses shunting transistors to provide a voltage across the terminals of an anti-fuse device to program the device. More specifically, a string of anti-fuse devices is constructed with one shunting transistor in parallel with each anti-fuse device such that the transistors form a series string parallel to the anti-fuse string. To program an anti-fuse device, the series of shunting transistors on each side of the anti-fuse device to be programmed are made conductive. Signal buses oriented perpendicular to the string of anti-fuse devices are used to make the selected strings of shunting transistors conductive. Transistors may then be made conductive in desired patterns to program selected anti-fuse devices by controlling the signals on the signal buses. In addition, these shunting transistors can be used to observe or to inject voltages at a desired node in the programmable/programmed array logic circuit.

One problem with this technique is the shunting transistors have a considerable series resistance. Consequently, the series impedance of the series string of shunting transistors limits the amount of power that can be forced into an anti-fuse device to program the anti-fuse device. Thus, in some circumstances the voltage drop across an anti-fuse device may not be sufficient to program some types of anti-fuse devices. This technique requires one programming transistor for every anti-fuse device in the system.

Another method for programming an array of anti-fuse devices, disclosed in U.S. Pat. No. 4,873,459, uses a row of transistors placed in parallel with the anti-fuse devices. This system enables programming a desired anti-fuse device using only two transistors in series with the anti-fuse device. These transistors are controlled by a signal bus that is parallel to the string of anti-fuse devices in which the anti-fuse device to be programmed is located. One disadvantage of this scheme is the requirement that an intermediate voltage be experienced by anti-fuse devices not meant to be programmed including the anti-fuse devices adjacent the anti-fuse device to be programmed. It is required that the intermediate voltage be insufficient to program spuriously a programmable element which may not be realizable with some types of anti-fuse devices. Another disadvantage of this scheme is that in order to observe voltages or to inject a voltage at a desired node, a second set of transistors is required. It is the second set of transistors, and not the programming transistors, which form the addressable virtual probe for observing internal test points to analyze the circuit connections of the programmable chip. Thus, this implementation limits the type of anti-fuse devices that can be used, and requires two programming transistors for every anti-fuse device.

There is thus a continuing need for improved circuits for programming anti-fuse devices that do not present large impedances, that improve selective application of programming devices, and that provide an addressable virtual probe without increasing the part count of the device.

SUMMARY OF THE INVENTION

It is an object of the present invention to provide for more efficient programming of anti-fuse devices. It is another object to program an anti-fuse device to a lower impedance by providing a greater voltage or a greater current, or both. Yet another object is to reduce the device part count for programming anti-fuse devices.

It is another object of the present invention to provide a transistor network for programming anti-fuse devices that also provides a virtual probe for testing the programmed circuit.

It is another objection of the present invention to provide for programming an anti-fuse device with no more than two programming transistors in series with the anti-fuse device. It is another object to use the same two series transistors to observe a voltage at a desired node in the programmable/programmed logic array circuit or to inject a voltage at a desired node. It is another object to provide for such programming and observation/injection using about one transistor for each anti-fuse device.

It is another object of the present invention to overcome the problem of spurious programming of any anti-fuse device by ensuring that no anti-fuse device is exposed to any significant voltage on the order of one half of the programming voltage.

The present invention teaches an improved apparatus and method for programming anti-fuse devices. Broadly, the invention concerns programming an anti-fuse device using only two programming transistors which are connected to different voltage supply buses and controlled to apply a differential voltage across the anti-use device sufficient to program the anti-fuse device to a low impedance condition.

One aspect of the invention is directed to a circuit for programming an anti-fuse device, which circuit can be applied to program any anti-fuse device in an integrated programmable chip. One embodiment of such a circuit involves a first voltage supply bus, a second voltage supply bus, a first programming transistor connected between the first voltage supply bus and one end of the anti-fuse device to be programmed, a second programming transistor connected between the second voltage supply bus and the other end of the anti-fuse device to be programmed, and a control bus network for selectively turning the first and second transistors ON and OFF. When used herein to describe the state of a transistor, the terms "ON" and "OFF" refer to the transistor being conducting and non-conducting respectively. Similarly, when used herein to describe the state of a control bus for a given transistor, the terms "ON" and "OFF" refer to a signal on the control bus that turns the given transistor ON and a signal on the control bus that turns the given transistor OFF, respectively.

One method of programming the anti-fuse device includes applying a first voltage $V_1$ to the first voltage supply bus, applying a second voltage $V_2$ to the second voltage supply bus, and applying a differential voltage, namely, $V_1-V_2-X$, across the anti-fuse device, where X is the net voltage drop across the first and second transistors, which connect the voltage buses to the anti-fuse device, in the ON state. Thus, if $V_1$ is greater than $V_2+X$ by more than the programming threshold voltage of the anti-fuse device, a programming action will occur and the anti-fuse device will be placed in its low impedance, conducting state. The method also is applicable to programming a series string of anti-fuse devices with a suitably large differential voltage applied at the ends of the string.

In the preferred embodiment, either $V_1$ or $V_2$ is at ground potential. The control bus network may be a single control bus for controlling the state of both transistors, or separate control buses may be used for each transistor. As is described in detail below, the use of common or different control buses for any one programming action is a matter of design choice.

Advantageously, the programming circuit of the present invention may be replicated and used to program any number of anti-fuse devices such that each anti-fuse device is connected between only two programming transistors which are in turn connected to different voltage supply buses.

Another aspect of the present invention is thus directed to a network of programming circuits for programming a string of anti-fuse devices which are a plurality of antifuse devices connected in series. One embodiment of such a network includes a first voltage supply bus, a second voltage supply bus, a plurality of first programming transistors respectively connected between the first voltage supply bus and one end of each of the plurality of anti-fuse devices, a plurality of second programming transistors respectively connected between the second voltage supply bus and the other end of each of the plurality of anti-fuse devices, and a control bus network for selectively turning ON a pair of first and second programming transistors. Thus, when any one pair of programming transistors is ON, the voltage difference between the first and second voltage buses is applied across the one anti-fuse device between the pair of programming transistors. In other words, each anti-fuse device is connected between the first and second voltage supply buses by a pair of first and second programming transistors and the pair of transistors are turned ON to program the anti-fuse device.

The method of programming one anti-fuse device of a string of anti-fuse devices using such a network includes applying a first voltage to the first voltage supply bus, applying a second voltage to the second voltage supply bus, turning ON the pair of programming transistors to apply the difference voltage across the anti-fuse device, and maintaining at least one programming transistor of each of the other pairs of programming transistors OFF so that no significant differential voltage is applied to the other anti-fuse devices of the string. Preferably, both programming transistors of the other pairs are maintained OFF.

The ends of each string of anti-fuse devices are preferably maintained as open circuits to prevent spurious signals from unintentionally programming a non-targeted anti-fuse device. The ends of each anti-fuse device string may be connected between a programmable chip input, a chip output, or a logic block. The user decides which functions are to be synthesized on the chip, and then programs the appropriate anti-fuse devices to create signal paths to realize the design. Given a programmable chip containing logic blocks and strings of anti-fuse devices defining possible signal paths, the user can write a software program to enable selectively the appropriate voltage supply buses and the control bus network on the chip in the proper sequence to program selected anti-fuse devices in a sequence that will achieve the desired interconnections. Because each device is isolated from the other devices, any programming sequence may be used. Thus, the present invention advantageously permits flexibility in the design of programmable chips containing anti-fuse devices.

In one embodiment of the invention, two programming transistors are provided for each anti-fuse device and there is one control bus that is connected to the two transistors associated with each anti-fuse device. Stated otherwise, for n anti-fuse devices in each series string, the part count is 2n programming transistors, n control buses, and 2 voltage supply buses.

Another embodiment of the present invention provides for reducing the total number of programming transistors fabricated on the chip such that only one programming transistor is connected between adjacent anti-fuse devices, and each anti-fuse device is programmed using the common programming transistor and a second programming transistor connected on its other side. In this embodiment, two control bus lines are required to turn ON the "pair" of programming transistors to program each anti-fuse device. In addition, the "second" programming transistors located on opposite sides of anti-fuse devices adjacent the anti-fuse device to be programmed are each turned OFF so that a differential voltage does not appear across those anti-fuse devices. Stated otherwise, for n anti-fuse devices in each series string, the part count is n+1 programming transistors, n+1 control bus lines, and 2 supply lines.

Yet another embodiment provides for reducing both the number of programming transistors and the number of voltage supply bus lines such that voltage supply buses are shared between parallel strings of anti-fuse devices. Stated otherwise, for m parallel strings of n series anti-fuse devices, the part count is m+1 voltage supply buses, m(n+1) programming transistors, and n+1 control bus lines. In this embodiment, the sequence of programming anti-fuse devices is prudently selected, and the voltages applied to the voltage supply buses of adjacent strings are carefully selected to minimize unintentional voltage differentials across other anti-fuse devices. Other configurations are also possible dependent on which design features are desired, and on ease of software implementation.

Advantageously, the present invention permits each antifuse device to be programmed in isolation. This minimizes any undesired programming voltages being applied to other anti-fuse devices on the chip. Further, the interconnection structures made possible by utilizing the anti-fuse device programming circuit enable a minimum number of other antifuse devices to be in series during the programming of any one anti-fuse device. As a consequence, lower impedances are used in the programming transistors which in turn result in a high programming current and faster programming speed than is available with prior known techniques. In addition, interconnection arrangements can be realized using a minimum number of signal buses on the programmable chip, and a minimum number of anti-fuse devices, to minimize the fabrication area of the chip and to thus maximize the number of chips realizable per silicon wafer and the number of logic devices on each programmable chip.

BRIEF DESCRIPTION OF THE DRAWINGS

Further features and advantages of the invention will become apparent from the drawings and the following detailed description of the invention, in which like reference characters refer to like elements, and in which.

DETAILED DESCRIPTION OF THE INVENTION

Figure 1:
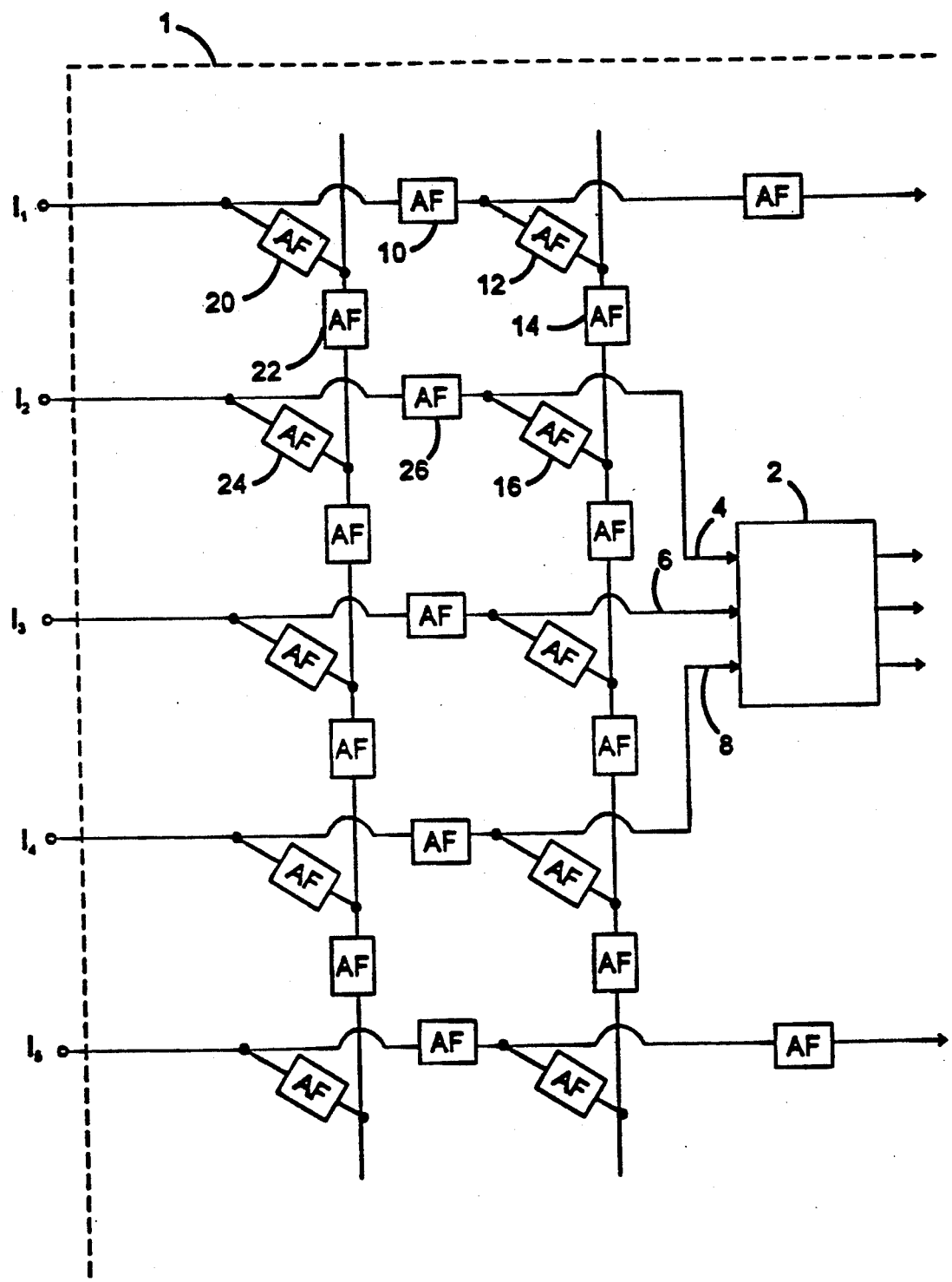
FIG. 1 is a simplified block diagram illustrating an interconnection structure of anti-fuse devices on part of a programmable semiconductor chip.

FIG. 1 illustrates an interconnection structure of antifuse devices labelled "AF" on a portion of a programmable semiconductor chip 1 having inputs $I_1$ to $I_5$. The anti-fuse devices are shown connected to each other in strings to define horizontal and vertical signal paths, and diagonal anti-fuse devices are shown connected to horizontal and vertical strings to form connecting nodes. Anti-fuse devices can also be connected between various logic blocks, or between logic blocks and chip output terminals.

An anti-fuse device is normally non-conducting and becomes a low impedance conductor only when its state is changed. Anti-fuse devices are used to establish interconnecting signal paths to achieve synthesis of arbitrary logic functions specified by a circuit designer. The structure of anti-fuse devices programmable by a voltage are known. See, e.g., U.S. Pat. No. 4,823,181. It is understood that commercial products available from Actel use a blown oxide film in their anti-fuse devices.

Referring to FIG. 1, a standardized logic block 2 is shown having three inputs 4, 6 and 8. A signal path between input $I_1$ of the programmable chip 1 and the logic block 2 may be established by programming the anti-fuse devices which lie between the two points to become low impedance conductors. For example, anti-fuse devices 10, 12, 14 and 16 could be programmed to provide a signal path from $I_1$ to the input 4 of logic block 2. Alternately, anti-fuse devices 20, 22, 24 and 26 could be programmed to achieve the same result. Other connections also are possible as selected by the programmer.

Figure 2:
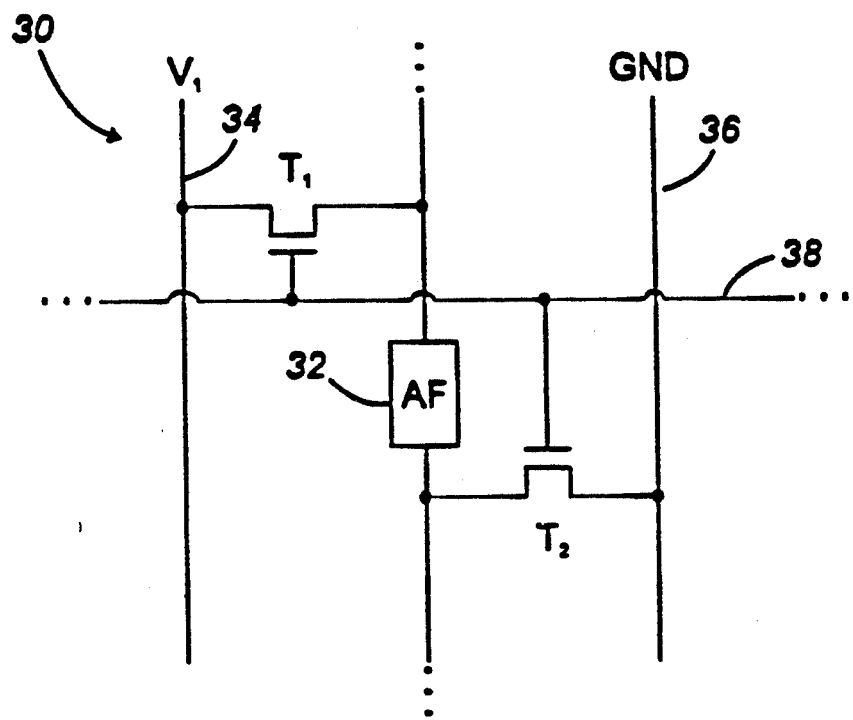
FIG. 2 is a schematic of a circuit for programming an anti-fuse device according to the present invention.

Referring to FIG. 2, an embodiment according to the present invention of an anti-fuse device programming circuit 30 includes a single anti-fuse device 32 connected between two transistors $T_1$ and $T_2$. Transistors $T_1$ and $T_2$ are preferably field effect transistors having a source, drain and a gate. Transistor $T_1$ is connected to a voltage bus 34, and $T_2$ is connected to a voltage bus 36, and both transistors receive the same gate voltage via connection to a common control bus 38. To program the anti-fuse device 32 a voltage $V_1$ is applied to the voltage supply bus 34, a second voltage, preferably ground potential, is connected to the voltage supply bus 36, and a voltage is applied to the gates of both transistors along the control bus 38 to turn ON the transistors. The polarity of the anti-fuse device is determined by choosing which supply bus is raised to $V_1$. Also, the voltage that is applied to the control buses has to be sufficiently high to turn ON the transistors and generally has to be higher than $V_1$. The polarity of an FET source or drain connection does not make a difference in that the operation is the same whether a P or N type transistor is used, except that $V_1$ will be different, and the anti-fuse device can be polarity sensitive.

An important feature of the anti-fuse programming interconnection circuit 30 of FIG. 2 is that only two programming transistors are in series with the anti-fuse device. Consequently, the impedance presented by the programming transistors $T_1$ and $T_2$ is low and a large percentage of the difference between the supply voltage $V_1$ and ground potential will appear across anti-fuse device 32. Thus, either a smaller supply voltage or a higher programming voltage may be used to program an anti-fuse device. This permits flexibility in the design of programmable semiconductor chips utilizing strings of anti-fuse devices. It is noted that programming uses a voltage to initiate the programming action and current to deliver power to complete the programming action.

Figure 3:
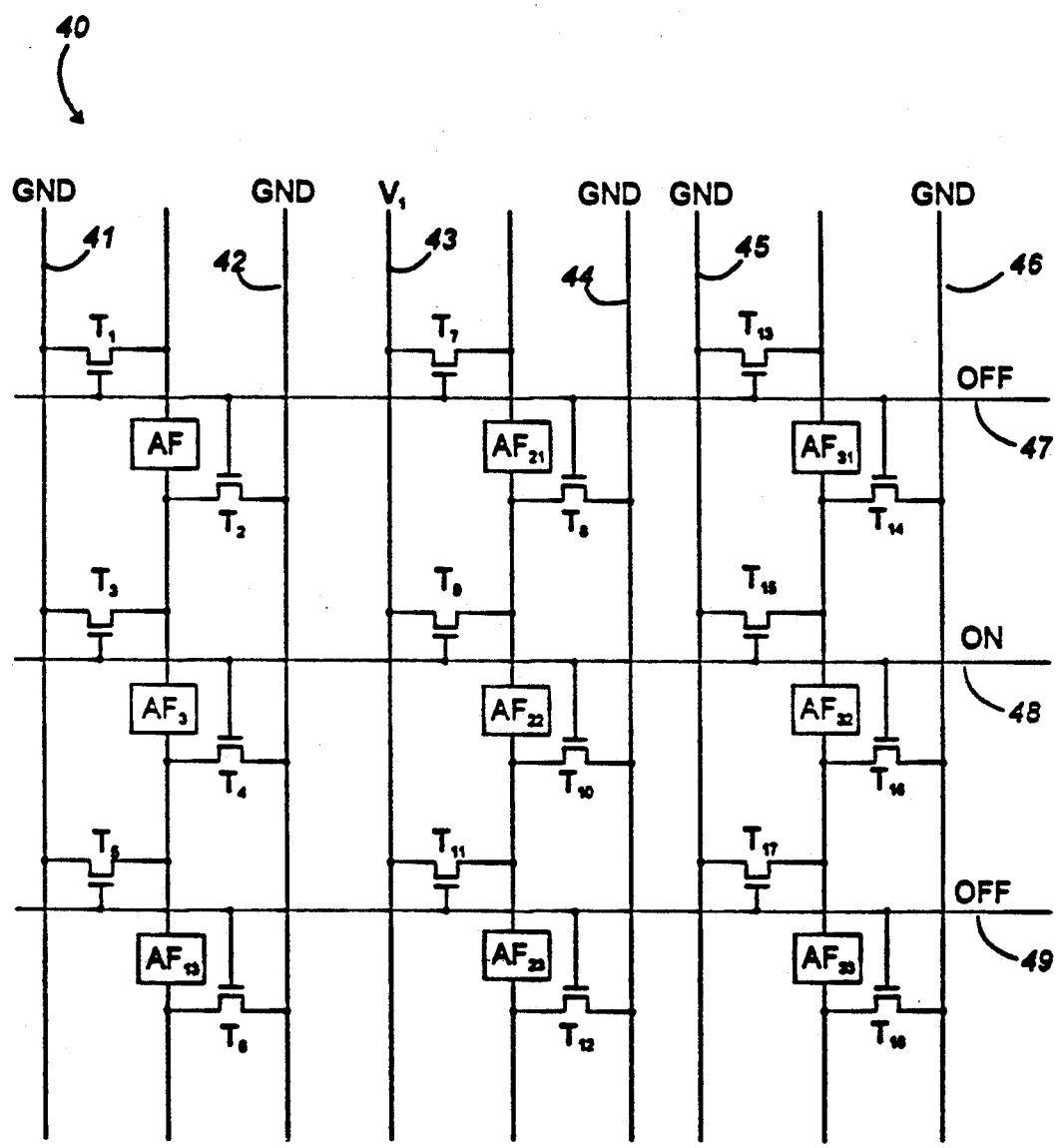
FIG. 3 is a schematic of a circuit for programming a plurality of interconnected anti-fuse devices based on the programming circuit of FIG. 2.

FIG. 3 depicts an interconnection structure 40 which is formed by connecting a plurality of the programming circuits of FIG. 2 in the middle of several other like circuits on a semiconductor chip. The configuration 40 of FIG. 3 depicts three vertical strings or columns with each column containing three anti-fuse devices arranged in series or rows. Thus, nine anti-fuse devices $AF_{x,y}$, wherein x refers to the column and y refers to the row, labeled $AF_{11}$ to $AF_{33}$, are shown connected to six supply buses 41 to 46 and to three control buses 47 to 49. Connected between the anti-fuse devices and the supply buses are the programming transistors $T_1$ to $T_{18}$. It should be understood that structure 40 is merely representative, and more or less anti-fuse devices may be connected in any particular column or may be connected in row configurations according to the design of the programmable semiconductor chip.

To program the anti-fuse device $AF_{22}$ of FIG. 3, supply bus 43 is connected to $V_1$, supply bus 44 is connected to ground, and control bus 48 is turned ON. All other pairs of voltage supply buses, namely the pair 41 and 42 and the pair 45 and 46, are connected to any voltage of convenience, such as ground potential as shown or $V_1$, so long as each pair is connected to the same voltage so that a voltage differential will not appear across a non-targeted anti-fuse device. This is to minimize the unintentional programming of an adjacent anti-fuse device such as $AF_{12}$ or $AF_{32}$ whose associated programming transistors $T_3$ and $T_4$, and $T_{15}$ and $T_{16}$, also will be turned ON by control bus 48. It is important to note that each vertical string of anti-fuse devices is maintained as an open circuit so that no paths exist which could cause spurious programming of other anti-fuse devices in a string. To program an adjacent anti-fuse device in another vertical string, i.e., an anti-fuse device in the same row and in a different column, for example, $AF_{32}$, the voltage $V_1$ would be applied to supply bus 45 and ground connected to supply bus 46 (or vice versa) while control bus 48 would remain ON. Preferably, voltage supply buses 43 and 44 are set to a common reference voltage at the same time.

Figure 4:
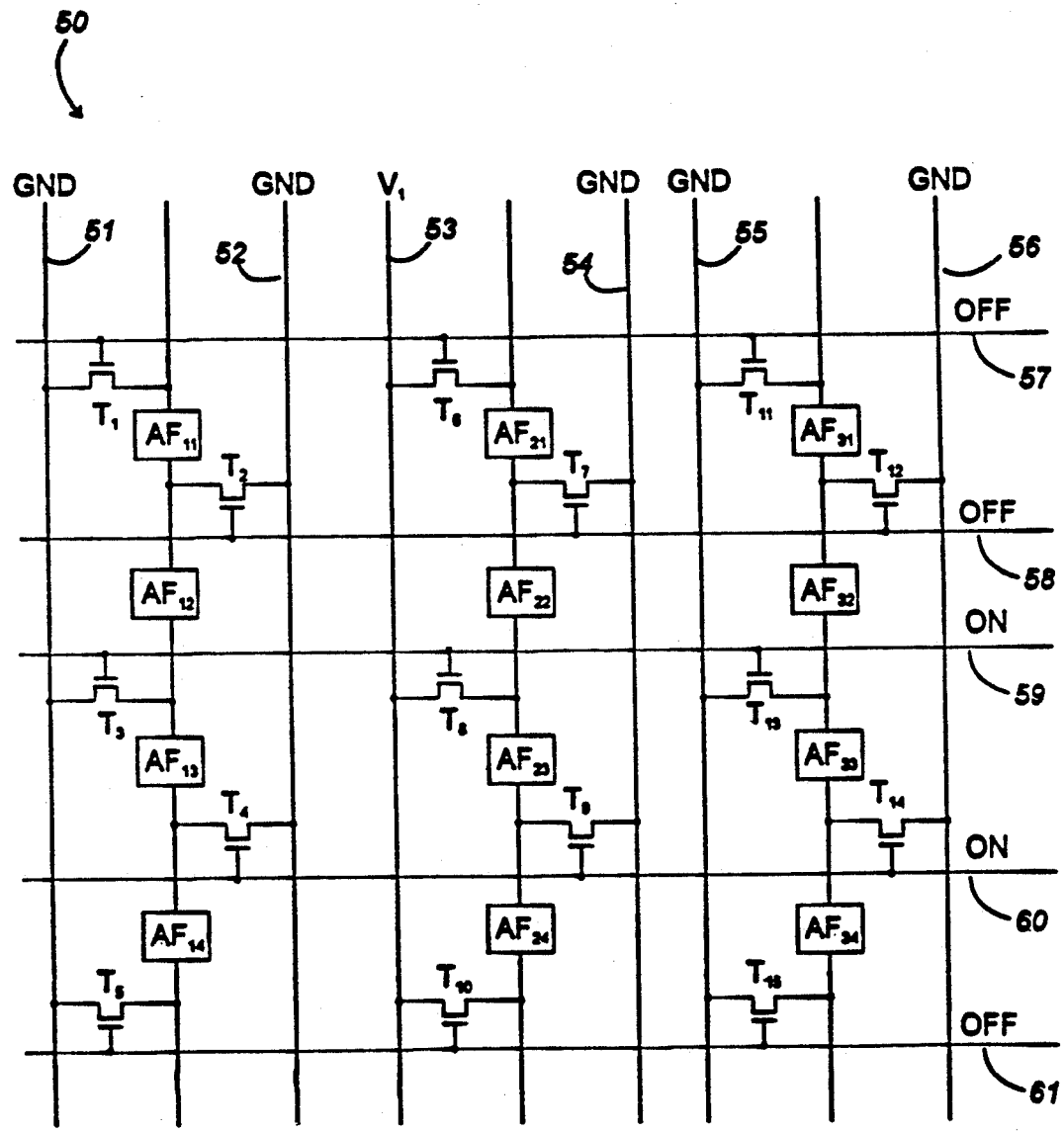
FIG. 4 is a schematic of a circuit for programming a plurality of interconnected anti-fuse devices according to another embodiment of the present invention.

The interconnection structure 40 of FIG. 3 requires the fabrication of two programming transistors for each anti-fuse device on the programmable chip. A reduction in the total amount of programming transistors is achieved if the interconnection arrangement 50 depicted in FIG. 4 is used. In this embodiment, each programming transistor is shared by two anti-fuse devices in a string, shown as columns. Advantageously, this results in having to fabricate only one more programming transistor per string than there are anti-fuse devices. Thus, in the three column strings and four rows per column network shown, only fifteen transistors ($T_1$ to $T_{15}$) are required to program the twelve anti-fuse devices shown.

Referring to FIG. 4, programming a particular anti-fuse device requires two control buses to be turned ON, and requires connecting one of the supply buses associated with that anti-fuse device to a programming voltage $V_1$, and connecting the other supply bus to ground potential. For example, to program $AF_{23}$ of FIG. 4, supply bus 53 is connected to $V_1$, supply bus 54 is connected to ground potential, and control buses 59 and 60 are turned ON. The other control buses are OFF, thus transistors $T_8$ and $T_9$ are made conducting to supply a voltage differential across anti-fuse device $AF_{23}$. To prevent programming any other anti-fuse devices which receive voltages when control buses 59 and 60 turn ON, their associated programming transistors must experience no voltage differential across their terminals. Thus, the pair of supply buses 51 and 52 and the pair of supply buses 55 and 56 must have the same applied voltage. This could be either $V_1$ or ground (as shown), whichever is convenient.

Again referring to FIG. 4, to program next another anti-fuse device on the same string, for example, anti-fuse device $AF_{22}$, supply buses 53 and 54 and control bus 59 would remain unchanged, control bus 60 would be turned OFF, and control bus 58 would be turned ON. Thus, transistors $T_7$ and $T_8$ would become conducting and the resulting voltage differential would program the anti-fuse device $AF_{22}$. This example illustrates that transistor $T_8$ is shared to program adjacent anti-fuse devices $AF_{22}$ and $AF_{23}$.

Referring again to FIG. 4, to program multiple anti-fuse devices on the same string, for example $AF_{21}$, $AF_{22}$ and $AF_{23}$, control lines 57 and 60 would be turned ON to make transistors $T_6$ and $T_9$ conduct, and a large enough programming voltage $V_1$ would be connected to supply bus 53 while supply bus 54 was connected to ground potential. It also is possible to program simultaneously a string of anti-fuse devices $AF_{21}$, $AF_{22}$ and $AF_{23}$ by turning ON control buses 57, 58, 59, and 60 and setting supply bus 53 to $V_1$ and supply bus 54 to ground.

To program an anti-fuse device on a different string of FIG. 4, for example $AF_{12}$, supply bus 51 would be connected to $V_1$, supply bus 52 would be connected to ground, and control buses 58 and 59 turned ON so that programming transistors $T_2$ and $T_3$ would become conducting and a voltage differential would appear across $AF_{12}$. Further, a horizontal string of anti-fuse devices may be programmed by turning ON the desired transistors and applying the supply buses alternately to ground and $V_1$. Thus, if control buses 58 and 59 are ON, any of anti-fuse devices $AF_{22}$, $AF_{32}$ may be simultaneously programmed by setting their respective voltage buses to $V_1$ and ground. In other words, an appropriate supply voltage and current may be selected and applied by selected programming transistors in parallel or serial, to a plurality of anti-fuse devices to program simultaneously those anti-fuse devices.

Figure 5:
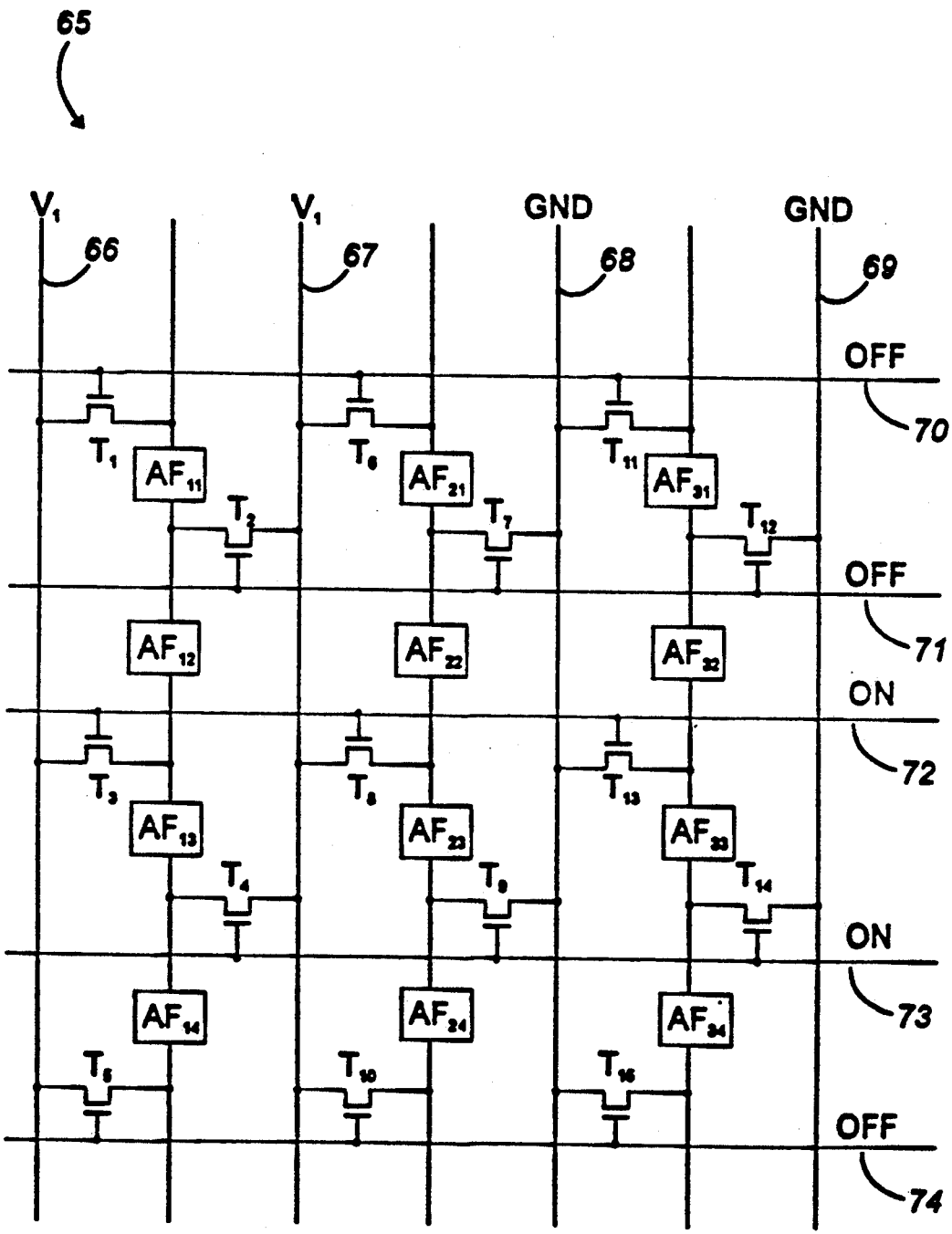
FIG. 5 is a schematic of a circuit for programming a plurality of interconnected anti-fuse devices according to another embodiment of the present invention.

Referring to FIG. 5, in accordance with another preferred embodiment, the total number of supply buses required to program the strings of anti-fuse devices can be reduced by employing the interconnection structure 65. As shown, only four supply buses 66 to 69 are required to program the three strings of anti-fuse devices. For example, to program $AF_{23}$ supply bus 67 is connected to $V_1$, supply bus 68 is connected to ground, and control buses 72 and 73 are turned ON. To program next $AF_{33}$, supply bus 68 is connected to $V_1$, while supply bus 69 continues to be connected to ground potential, and control lines 72 and 73 remain ON.

Those anti-fuse devices not meant to be programmed that share programming transistors that are turned ON by signals from control buses 72 and 73 must experience no significant voltage differential across their terminals. Thus, in the example of programming $AF_{23}$, it is required that all voltage supply buses for the programming transistors for anti-fuse device strings to the left of supply bus 67 be at $V_1$, and all voltage supply buses for anti-fuse strings to the right of supply bus 68 be at ground potential.

If it were desired to program three anti-fuse devices in a string configured as shown in FIG. 5, the first associated supply bus would be connected to an appropriate programming voltage $V_1$, the second associated supply bus would be connected to ground potential, and the outermost programming transistors would be turned ON via their respective control buses. For example, if anti-fuse devices $AF_{32}$, $AF_{33}$ and $AF_{34}$ were to be programmed at the same time, supply bus 68 would be connected to programming voltage V, supply bus 69 would 74 turned ON, while all other control lines are OFF, so that transistors $T_{12}$ and $T_{15}$ would conduct and a voltage differential appears across $AF_{32}$, $AF_{33}$ and $AF_{34}$. For the reasons already noted, in an alternate embodiment, anti-fuse devices $AF_{32}$, $AF_{33}$ and $AF_{34}$ could be simultaneously programmed by turning control buses 71, 72, 73, and 74 ON and setting supply bus 68 to $V_1$ and supply bus 69 to ground. Another embodiment provides for simultaneously programming anti-fuse devices $AF_{13}$, $AF_{23}$, and $AF_{33}$ by turning control buses 72 and 73 ON and setting supply bus 66 to V, supply bus 67 to ground, supply bus 68 to $V_1$, supply bus 69 to ground, supply buses to the left of bus 66 to $V_1$, and supply buses to the right to ground. Thus, both serial and parallel programming is possible, subject to the voltage and current carrying capacities of the control bus and supply bus and the driver circuits.

The anti-fuse device interconnect architectures described herein are particularly useful when combined with chip fabrication techniques that employ a four-level metal interconnect process as described in Wilson et al., "A Four-Metal Layer, High Performance Interconnect System for Bipolar and BiCMOS Circuits", *Solid State Technology*, Nov. 1991, pp. 67–71. The availability of such four-level metal runs technology avoids any increase in the size of the semiconductor chip manufactured using the conventional two-level or three-level metal interconnect processes to implement the control bus and supply bus runs of the present invention.

Figure 6:
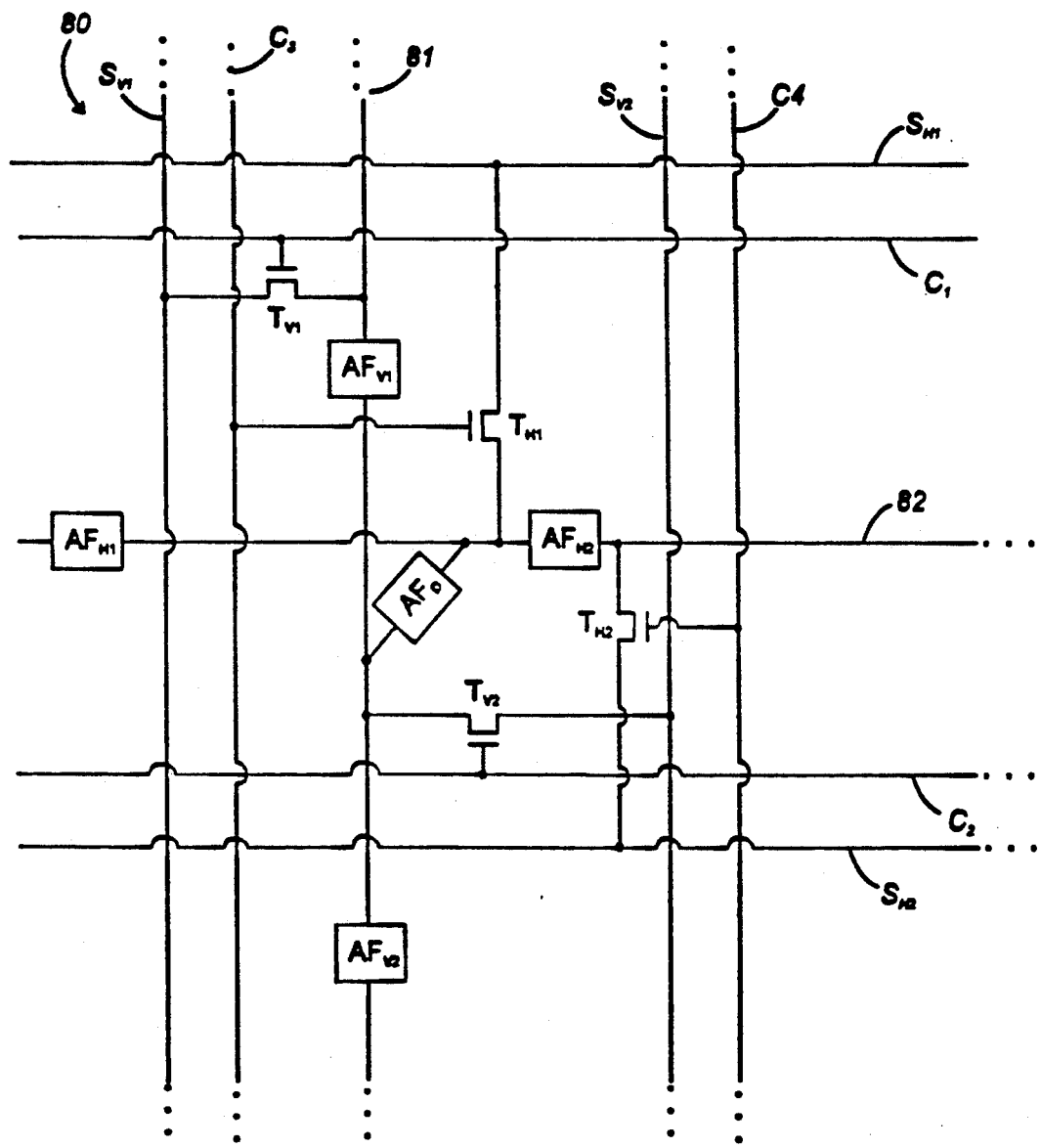
FIG. 6 is a partial schematic of a circuit for programming a plurality of interconnected anti-fuse devices according to another embodiment of the present invention.

FIG. 6 depicts an area of detail 80 of a programmable semiconductor chip which incorporates vertical and horizontal anti-fuse device strings and anti-fuse devices connecting the vertical and horizontal strings. Area 80 depicts a portion of one vertical device string 81 having anti-fuse devices $AF_{V1}$ and $AF_{V2}$, a portion of one horizontal device string 82 having anti-fuse devices $AF_{H1}$ and $AF_{H2}$, and a diagonal anti-fuse device $AF_D$. The diagonal anti-fuse device $AF_D$ connects the horizontal device string 82 and vertical device string 81 such that if $AF_D$ were programmed to conduct, then anti-fuse devices $AF_{H1}$, $AF_{H2}$, $AF_{V1}$ and $AF_{V2}$ would be connected to a common node. The ends of the anti-fuse device strings 81 and 82 are maintained as open circuits during programming to avoid spurious programming signal paths.

Referring to FIG. 6, to program the vertical string antifuse device $AF_{V1}$, supply bus $S_{V1}$ would be connected to a programming voltage $V_1$, supply bus $S_{V2}$ would be connected to ground potential and the control buses $C_1$ and $C_2$ would be turned ON so that transistors $T_{V1}$ and $T_{V2}$ would become conducting. Likewise, to program the horizontal string anti-fuse device $AF_{H2}$, supply bus $S_{H1}$ would be connected to $V_1$, supply bus $S_{H2}$ connected to ground, and the control buses $C_3$ and $C_4$ would be turned ON so that transistors $T_{H1}$ and $T_{H2}$ would become conducting. To program a diagonal anti-fuse device, one need only recognize that each node between any vertical string anti-fuse device connects to some transistor that connects to a vertical supply bus and which has its gate connected to a control bus, and conversely, each node between any horizontal string anti-fuse device connects to some transistor that connects to a horizontal supply bus and which has its gate connected to another control bus. Thus, a voltage differential can be connected across a diagonal device by turning ON one transistor usually associated with a vertical string anti-fuse device and one transistor usually associated with horizontal string anti-fuse device. For example, to program the diagonal anti-fuse device $AF_D$ of FIG. 6, horizontal string supply bus $S_{H1}$ is connected to $V_1$, control bus $C_3$ is turned ON, vertical string supply bus $S_{V2}$ is connected to ground, and control bus $C_2$ is turned ON. Thus, both horizontal transistor $T_{H1}$ and vertical transistor $T_{V2}$ are made conducting and a voltage differential appears across $AF_D$.

A programmable semiconductor chip having vertical and horizontal strings of anti-fuse devices may be difficult to program if the supply buses, control buses and programming transistors are not logically laid out. The embodiments of the present invention described above in FIGS. 3 to 6 lend themselves to simple rules for programming any anti-fuse device. For example, to program an anti-fuse device in a vertical string in the interconnection configuration of FIG. 6 wherein the vertical string is provided with parallel supply voltage buses and horizontal control buses, the two horizontal control buses adjacent to it must be turned ON, one of the vertical supply buses adjacent to it must be connected to programming voltage $V_1$ while the other supply bus adjacent to it is connected to ground potential, and all other control buses must be OFF. To program an anti-fuse device in a horizontal string connected in the configuration of FIG. 6, wherein the horizontal string is provided with adjacent horizontal voltage supply buses and vertical control buses, the vertical control buses adjacent to it must be turned ON, one of the horizontal supply buses adjacent to it must be connected to programming voltage $V_1$ while the other supply bus adjacent to it is connected to ground potential, and all of the other control buses must be OFF. In addition, the ends of both vertical and horizontal device strings must be open.

The programming circuits of the present invention are in essence superimposed in parallel to the logic circuit of the programmable chip ultimately implemented by programming of the anti-fuse devices. It has been discovered that the above described embodiments also may be used to the inject and observe diagnostic signals at selected locations in the logic circuit. Thus, the programming circuit also may be used to determine the response of the programmable chip to various signals within the chip. Importantly, any interior point of the chip can be accessed using the circuits for programming the anti-fuse devices. This is because the circuit is constructed by selectively inter-connecting anti-fuse devices, and each node at a terminal of an anti-fuse device is connected to a programming transistor. Each programming transistor is in turn connected between a voltage supply bus and the node and may be turned ON by a single control bus. Thus, a connection to any point is available either to inject a signal or to observe a signal via that voltage supply bus.

Figure 7:
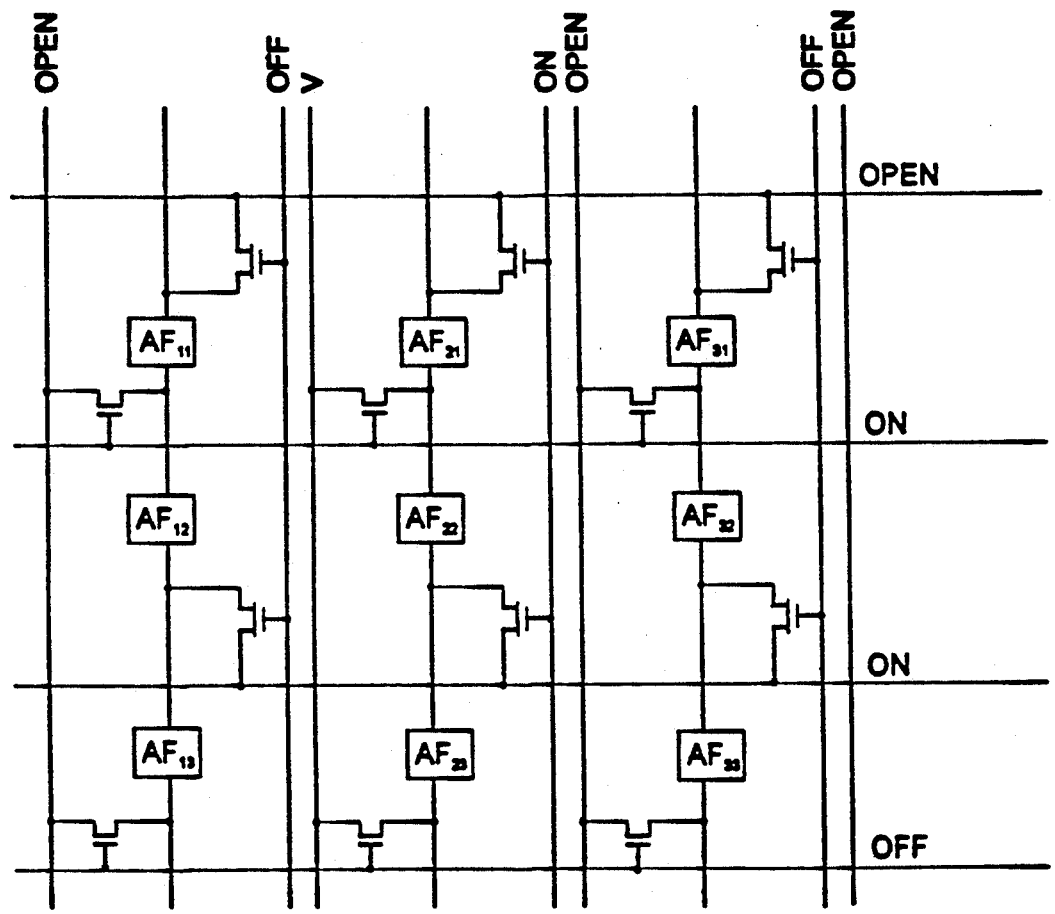
FIG. 7 is a schematic of a circuit for programming a plurality of interconnected anti-fuse devices according to another embodiment of the present invention.

It is to be understood that other arrangements of anti-fuse devices employing the programming circuits described above are contemplated by the present invention. For example, FIG. 7 depicts vertical strings of anti-fuse devices which employ a one-horizontal, one-vertical control bus network configuration to program a particular anti-fuse device. This arrangement permits the use of fewer horizontal lines for programming the vertical device strings, and correspondingly, fewer vertical lines for programming horizontal device strings. In addition, once a horizontal control line has been turned ON, several column supply buses can be actuated to simultaneously program their devices to the same polarity, which permits faster antifuse device programming. However, the configuration of FIG. 7 requires a different and more complicated mode of signal observation.

Thus, ease of software implementation, both for programming of the anti-fuse devices and for diagnostic signal analysis should be considered when deciding which anti-fuse device interconnection architecture to fabricate. In addition, the amount of programming current that can be accommodated by the peripheral drivers or the incoming wiring leads must be considered when attempting to program more than one anti-fuse device simultaneously.

Figure 8:
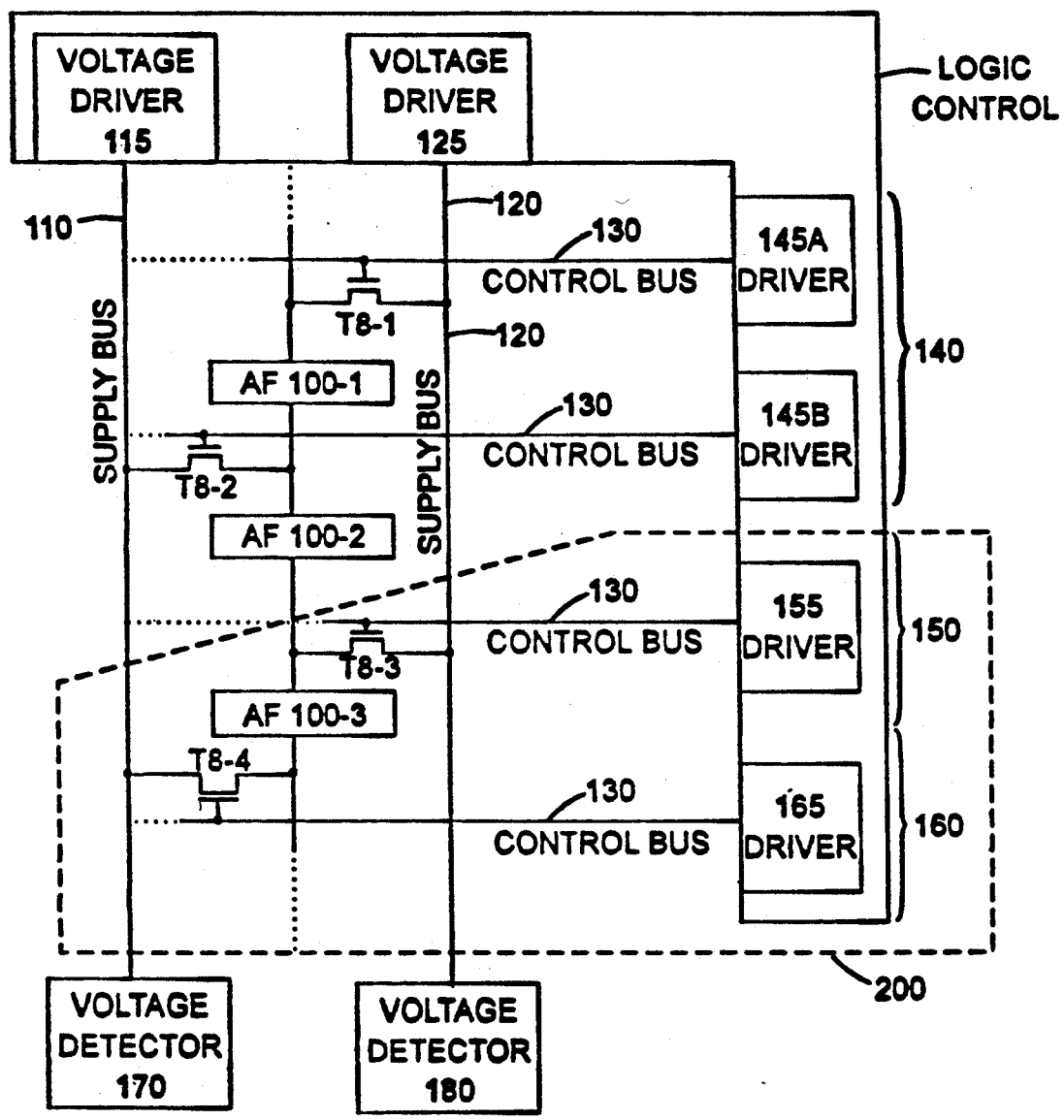
FIG. 8 is a schematic of a circuit for programming a plurality of interconnected anti-fuse devices according to another embodiment of the present invention.

Referring to FIG. 8, a basic unit circuit for programming an anti-fuse device, for observing a voltage at a node adjacent an anti-fuse device, and for injecting a voltage at a node adjacent an anti-fuse device is shown. This circuit includes a first plurality of anti-fuse devices AF100-$n$, $n=1, 2, 3$, connected in series, each anti-fuse device having a first and second end and a node at each first and second end in the series string, a first supply bus 110 having a voltage driver circuit 115 for passing a selected voltage on supply bus 110, a second supply bus 120 having a voltage driver circuit 125 for passing a voltage on supply bus 120, a first plurality of transistors T8-$p$, $p=1, 2, 3, 4$, connecting each of the plurality of anti-fuse devices to the first and second supply buses so that one transistor T8-$p$ connects each node to one of the first and second supply buses 110 and 120 and adjacent nodes are connected to different supply buses, each transistor having an ON and OFF condition, and a control bus network 130 for selectively turning each transistor ON and OFF. The control bus network 130 and transistors T8-$p$ are controlled by control logic circuit means for selectively turning transistors T8-$p$ ON and OFF to connect nodes to a supply bus (in this illustration bus 110 or 120) to program an anti-fuse device AF-100, to monitor the voltage at a node, or to inject a voltage into a node. The control logic circuit is user programmable and is illustrated as including a first logic control means 160 having a voltage driver circuit 165 for turning ON the one transistor connected to a selected node, e.g., T8-4, so that the voltage at the selected node appears on the supply bus, e.g., bus 110 connected to the one ON transistor T8-4, for monitoring the voltage at the node. Control logic also includes a second logic control means 150 having a voltage driver circuit 155 for turning ON the one transistor connected to a selected node, e.g., T8-3, so that the voltage on the supply bus connected to the one ON transistor is injected at the selected node. The control logic also includes a third control logic means 140 having voltage driver circuits 145A and 145B for turning ON a first transistor, e.g., T8-1, and a second transistor, e.g., T8-2, which are connected to adjacent nodes so that any voltage difference applied to the first and second supply buses 110 and 120 is applied across the anti-fuse device AF 100-1, connected between the first and second ON transistors, for programming that anti-fuse device.

Preferably, the circuit also includes a first voltage detector 170 for monitoring the voltage on the first supply bus 110, and a second voltage detector 180 for monitoring the voltage on the second supply bus 120.

In the embodiment illustrated in FIG. 8, the first control logic means 160 also controls the first and second voltage detectors 170 and 180 to sense the voltage at the node connected to the one ON transistor.

It should be understood that the first and second control logic means 160 and 150 illustrated in FIG. 8 also could be operated cooperatively to program anti-fuse device AF 100-3 in the same manner that control logic means 140 is used in program anti-fuse device AF-100-1. It also should be understood that the function of first and second control logic means 150 and 160 can be reversed by user choice. Similarly, the circuit illustrated as control logic means 140 also can be reconfigured by the user to operate independently driver circuits 145A and 145B, to perform the voltage monitoring or injection functions attributed to the control logic means 150 and 160. In addition, the "third control logic means" also could be comprised of driver circuits 145B and 155 for programming AF 100-2. Hence, the basic unit of the circuit of this embodiment of the present invention is illustrated by the dashed line 200 which includes one anti-fuse device, two transistors which connect the two ends of the anti-fuse device to different supply buses (which have suitable voltage drivers and voltage monitors), and the portion of the control bus network 130 and control logic circuit means (140, 150, 160) for selectively turning on one or both of the transistors to achieve one of the anti-fuse programming node monitoring and node injection function under user control.

It also should be understood that the basic unit circuit 200 is repeated for each anti-fuse device, although in different embodiments adjacent anti-fuse devices AF-100 may or may not share transistors T8 at the common node. Further, additional supply buses also will have voltage driver circuits and voltage monitoring circuits as in the two buses illustrated. The control bus network 130 may alternatively have any of the network configurations illustrated in any of the embodiments described in this specification, provided that suitable control logic means and transistors T8 are also provided.

The terms "transistor" and "programming transistor" as used herein refers to any circuit element or device that can be used to connect an anti-fuse device between two voltage supply buses, provided that such circuit element or device may be selectively turned ON and OFF to make and break the connection, including without limitation, diodes, bipolar transistors, field effect transistors, MOSFET type transistors, and equivalent structures, preferably MOSFET type transistors which can be readily formed as part of the integrated circuit containing the anti-fuse devices.

Advantageously, the present invention discloses an anti-fuse device programming circuit and interconnection structures which require only two series programming transistors to program an anti-fuse device, and which result in a larger percentage of the programming voltage appearing across the anti-fuse device than is available with the prior known devices. This permits the use of smaller programming transistors resulting in smaller chip size or conversely, higher programming currents could be used for faster operation. In addition, lower programming voltages could be used which may be required by newer processes.

Another advantage of the invention is that each anti-fuse device may be programmed to conduct signals with the same speed, unless otherwise programmed. In this regard, the anti-fuse devices may be differently programmed to minimize signal race conditions of logic signals. This occurs when two signals travel along different length signal paths to the same end point and thus might reach the end point at different times. By suitable programming of the anti-fuse device, a lower impedance can be implemented in the longer path so that the signals reach the same end point effectively simultaneously.

The present invention also permits the use of low impedance supply buses, made of materials such as metal, which can extend across an entire chip without need for intermediate ground connections or partitions circuits which limit the length of the conductor run. The invention also overcomes the need to produce "safe" intermediate voltages so as not to program non-targeted anti-fuse devices as required by the prior art U.S. Pat. No. 4,876,459, and eliminates the need for a separate network of series-bypass transistors and control buses for each anti-fuse device as in the prior art devices. Further, the present invention permits the formulation of simple to follow anti-fuse device programming rules.

The preferred embodiments illustrated and described with respect to the drawings herein are given by way of example only. In view of the above description, it will be obvious to one of ordinary skill in the art to make various modifications and changes without departing from the spirit and scope of the present invention.

I claim:

1. A circuit for programming an anti-fuse device, for observing a voltage at a node adjacent an anti-fuse device, and for injecting a voltage at a node adjacent an anti-fuse device, comprising:
   a first plurality of anti-fuse devices connected in series, each anti-fuse device having a first and second end and a node at each first and second end in the series string;
   a first supply bus for passing a voltage there along;
   a second supply bus for passing a voltage there along;
   a plurality of transistors connecting each of the plurality of anti-fuse devices to the first or second supply buses so that each transistor connects each node to one of the first and second supply buses and each of the other transistors connects adjacent nodes to other of the first and second supply buses, each transistor having a control terminal for placing the transistor in an ON and OFF condition;
   a control bus network connected to the control terminals of the plurality of transistors for selectively turning each transistor ON and OFF;
   a first logic control means, connected to the control bus network, for turning ON the one transistor connected to a selected node so that the voltage at the selected mode appears on the supply bus connected to the one ON transistor;
   a second logic control means, connected to the control bus network, for turning ON the one transistor connected to a selected node so that the voltage on the supply bus connected to the one ON transistor is injected at the selected node; and
   a third control logic means, connected to the control bus network, for turning ON a first transistor and a second transistor which are connected to adjacent nodes so that any voltage difference applied to the first and second supply buses is applied across the anti-fuse device connected between the first and second ON transistors.

2. The circuit of claim 1 further comprising:
   a first voltage source capable of supplying a first voltage to the first supply bus; and
   a second voltage source capable of supplying a second voltage to the second supply bus;
   wherein the second logic control means operates one of the first and second voltage sources connected to the one of the first and second supply buses connected to the one ON transistor to apply the voltage to the supply bus; and
   wherein the third logic control means operates the first and second voltage sources to apply a voltage difference to the first and second supply buses.

3. The circuit of claim 2 wherein the third logic control means operates the first and second voltage sources to apply a voltage difference to the first and second supply buses that is sufficient to program the anti-fuse device between the first and second ON transistors.

4. The circuit of claim 3 wherein the differential voltage is sufficient to program each anti-fuse device in series between the first and second ON transistors.

5. The circuit of claim 1 wherein the control bus network further comprises a separate control bus for each of the plurality of transistors.

6. The circuit of claim 5 wherein each control bus is oriented perpendicular to the series string of anti-fuse devices and the first and second supply buses.

7. The circuit of claim 1 further comprising:
   a first voltage detector for monitoring the voltage on the first supply bus; and
   a second voltage detector for monitoring the voltage on the second supply bus;
   wherein the first control logic means controls the first and second voltage detectors to sense the voltage at the node connected to the one ON transistor.

8. A method of assembling pluralities of circuit elements, anti-fuse devices, transistors, and supply buses, and a control bus network for forming a programmable array logic device on a substrate and for injecting voltages and sensing voltages at nodes between adjacent anti-fuse device comprising:
   locating the circuit elements at selected locations on the substrate;
   interposing one or more anti-fuse devices in series between each one circuit element that is connectable to each other circuit element located on the substrate;
   passing a pair of supply buses adjacent each antifuse device so that the same pair of supply buses are adjacent each anti-fuse device connected in a series string of anti-fuse devices;
   connecting each anti-fuse device to its adjacent pair of supply buses by a first transistor connected between one end of the anti-fuse device and one of the pair of supply buses and a second transistor connected between the other end of the anti-fuse device and the other of the pair of supply buses;
   providing a voltage driver for each control bus for applying a selected voltage on said supply bus;
   providing a voltage detector at each of the plurality of supply buses for observing the voltage on the supply bus; and
   connecting each of the transistors to the control bus network and configuring the control bus network so that each transistor connected between an anti-fuse node and a supply bus can be turned ON for passing the voltage at the node along the supply bus to the voltage monitor for the supply bus and for injecting a voltage applied to the supply bus into the node, and so that each first and second transistors connecting one anti-fuse between a pair of supply buses can be turned ON for applying the selected voltages respectively applied to the pair of supply buses to the one anti-fuse device.

9. The method of claim 8 further comprising forming the assembly into a programmed logic array circuit by selectively turning ON pairs of transistors connecting a pair of supply buses to one or more series string anti-fuse devices and applying a differential voltage across the pair of voltage supply buses for programming each selected anti-fuse device to a conducting state, thereby connecting selected ones of circuit elements to selected others of circuit elements.

10. The method of claim 9 further comprising:
    monitoring signals generated at a first selected anti-fuse node; and determining whether or not the formed programmed logic array is properly connected by said programmed anti-fuse device in response to the monitored signals.

11. The method of claim 10 further comprising injecting selected voltage signals at a second selected node in the programmed logic array, wherein monitoring signals further comprises monitoring the response of the programmed logic array at the first selected node in response to the injected voltage at the second selected node.

12. A programmed logic circuit array device made according to the process of claim 9.

13. A circuit for programming an anti-fuse device comprising:
   a first anti-fuse device having a first end and a second end and a threshold programming voltage;
   a first transistor and a second transistor respectively connected to the first and second ends of the first anti-fuse device in series, each transistor having an ON and OFF condition;
   a first voltage supply bus for receiving a first voltage and a second voltage supply bus for receiving a second voltage, wherein the first transistor, first antifuse device and second transistor form a series connection between the first voltage supply bus and the second supply bus; and
   a control bus network connected to the first and second transistors for turning ON and OFF the first and second transistors.

14. The apparatus of claim 13 wherein the control bus network further comprises:
   a first control bus connected to the first transistor for turning ON and OFF the first transistor; and
   a second control bus connected to the second transistor for turning ON and OFF the second transistor.

15. The apparatus of claim 13 wherein the control bus network further comprises a single control bus for turning ON and OFF the first and second transistors.

16. The circuit of claim 13 further comprising;
   means for applying one of the first and second voltages to the first voltage supply bus;
   means for applying the other of the first and second voltages to the second voltage supply bus; and
   wherein the first voltage is greater than the second voltage by more than the threshold programming voltage; and
   means for operating the control bus network to turn ON the first and second transistors to apply the difference voltage between the first and second voltage across the anti-fuse device.

17. The apparatus of claim 13 wherein the control bus network further comprises:
   a first control bus for turning ON the first transistor for observing voltages at the first end of the anti-fuse device and for injecting a voltage received at the first voltage supply bus to the first end of the anti-fuse device; and
   a second control bus for turning ON the second transistor for observing voltage at the second end of the anti-fuse device and for injecting a voltage received at the second voltage supply bus to the second end of the anti-fuse device.

18. The apparatus of claim 17 further comprising a voltage detector for observing the voltage at one of the first and second ends of the anti-fuse device in response to one of the first and second transistors being turned ON.

19. The apparatus of claim 17 further comprising:
   a first voltage driver for applying a voltage to the first voltage supply bus; and
   a second voltage driver for applying a voltage to the second voltage supply bus.

20. The apparatus of claim 13 further comprising:
   a second anti-fuse device having a first end, a second end, and a threshold programming voltage, the first end being connected to the second end of the first antifuse device;
   a third voltage supply bus for receiving a third voltage;
   a third transistor having an ON and OFF condition connected between the second end of the second anti-fuse device and the third voltage supply bus, wherein the control bus network is connected to the first, second and third transistors for selectively turning the same ON and OFF.

21. The apparatus of claim 20 wherein the control bus network further comprises:
   a first control bus for turning the first and third transistors ON and OFF contemporaneously; and
   a second control bus for turning the second transistor ON and OFF.

22. The apparatus of claim 20 further comprising:
   a third anti-fuse device having a first end, a second end, and a threshold programming voltage, the first end being connected to the second end of the second antifuse device, a fourth transistor having an ON and OFF condition connected between the second end of the third anti-fuse device and the second voltage supply bus, wherein the control bus network is connected to the first, second, third, and fourth transistors for selectively turning the same ON and OFF.

23. The apparatus of claim 22 wherein the control bus network further comprises:
   a first control bus for turning the first and third transistors ON and OFF contemporaneously;
   a second control bus for turning ON and OFF the second transistor; and
   a third control bus for turning ON and OFF the fourth transistor.

24. The apparatus of claim 13 further comprising:
   a second anti-fuse device having a first end, a second end, and a threshold programming voltage;
   a third voltage supply bus for receiving a third voltage;
   a third transistor for connecting the first voltage supply bus to the first end of the second anti-fuse device;
   a fourth transistor for connecting the third voltage supply bus to the second end of the second anti-fuse device wherein the control bus network is connected to the first, second, third, and fourth transistors for selectively turning the same ON and OFF.

25. The apparatus of claim 24 wherein the control bus network further comprises:
   a first control bus connected to the first transistor for turning the first transistor ON and OFF;
   a second control bus connected to the second and fourth transistors for turning the second and fourth transistors ON and OFF contemporaneously; and
   a third control bus connected to the third transistor for turning the third transistor ON and OFF.

26. The apparatus of claim 20 further comprising:
   a third anti-fuse device having a first end and a second end and a threshold programming voltage;

a fourth voltage supply bus for receiving a fourth voltage;

a fourth transistor having an ON and OFF condition connecting the first end of the third anti-fuse device to the first voltage supply bus; and a fifth transistor having an ON and OFF condition connecting the second end of the third anti-fuse device to the fourth voltage supply bus, wherein the control bus network also is connected to the fourth and fifth transistors for turning the fourth and fifth transistors ON and OFF.

27. The apparatus of claim 26 wherein the control bus network further comprises:

a first control bus connected to the first and third transistors for turning the first and third transistors ON and OFF contemporaneously;

a second control bus connected to the second and fifth transistors for turning the second and fifth transistors ON and OFF contemporaneously;

a third control bus connected to the fourth transistor for turning the fourth transistor ON and OFF.

28. The apparatus of claim 26 further comprising:

a fourth anti-fuse device having a first end, a second end, and a threshold programming voltage, the first end being connected to the second end of the third anti-fuse device;

a sixth transistor having an ON and OFF condition connecting the second end of the fourth anti-fuse device to the third voltage supply bus, wherein the control bus network also is connected to the sixth transistor for selectively turning the sixth transistor ON and OFF.

29. The apparatus of claim 28 wherein the control bus network further comprises:

a first control bus connected to the first and third transistors for turning the first and third transistors ON and OFF contemporaneously;

a second control bus connected to the second and fifth transistors for turning the second and fifth transistors ON and OFF contemporaneously;

a third control bus connected to the fourth and sixth transistors for turning the fourth and sixth transistors ON and OFF contemporaneously.

30. The apparatus of claim 28 wherein the first and second anti-fuse devices are in one string of anti-fuse devices and the third and fourth anti-fuse devices are in another string of anti-fuse devices.

31. The apparatus of claim 20 further comprising means for operating the control bus network to turn ON a pair of transistors to apply a different voltage across one of the said anti-fuse devices and not other of said anti-fuse devices.

32. The apparatus of claim 22 further comprising means for operating the control bus network to turn ON a pair of transistors to apply a different voltage across one of the said anti-fuse devices and not other of said anti-fuse devices.

33. The apparatus of claim 24 further comprising means for operating the control bus network to turn ON a pair of transistors to apply a different voltage across one of the said anti-fuse devices and not other of said anti-fuse devices.

34. The apparatus of claim 26 further comprising means for operating the control bus network to turn ON a pair of transistors to apply a different voltage across one of the said anti-fuse devices and not other of said anti-fuse devices.

35. The apparatus of claim 28 further comprising means for operating the control bus network to turn ON a pair of transistors to apply a different voltage across one of the said anti-fuse devices and not other of said anti-fuse devices.

36. The apparatus of claim 20 further comprising means for operating the control bus network and means for providing a first and second voltage for programming one of said anti-fuse devices with a first low impedance and another of said anti-fuse devices with a second low impedance different from said first low impedance.

37. The apparatus of claim 22 further comprising means for operating the control bus network and means for providing a first and second voltage for programming one of said anti-fuse devices with a first low impedance and another of said anti-fuse devices with a second low impedance different from said first low impedance.

38. The apparatus of claim 24 further comprising means for operating the control bus network and means for providing a first and second voltage for programming one of said anti-fuse devices with a first low impedance and another of said anti-fuse devices with a second low impedance different from said first low impedance.

39. The apparatus of claim 26 further comprising means for operating the control bus network and means for providing a first and second voltage for programming one of said anti-fuse devices with a first low impedance and another of said anti-fuse devices with a second low impedance different from said first low impedance.

40. The apparatus of claim 28 further comprising means for operating the control bus network and means for providing a first and second voltage for programming one of said anti-fuse devices with a first low impedance and another of said anti-fuse devices with a second low impedance different from said first low impedance.

41. A circuit for programming an anti-fuse device comprising:

a first anti-fuse device and a second anti-fuse device, each anti-fuse device having a first end and a second end and a threshold programming voltage, the first and second anti-fuse devices being connected in series at the second end of the first anti-fuse device;

a first voltage supply bus and a second voltage supply bus;

a first programming transistor connected between the first voltage supply bus and the first end of the first anti-fuse device;

a second programming transistor connected between the second voltage supply bus and the second end of the first anti-fuse;

a third programming transistor connected between the first voltage supply bus and the first end of the second anti-fuse;

a fourth programming transistor connected between the second voltage supply bus and the second end of the second anti-fuse; and a control bus network for turning the first, second, third and fourth programming transistors ON and OFF to program selectively one of the first and second anti-fuse devices.

42. The apparatus of claim 41, wherein the control bus network comprises:

a first control bus for turning ON and OFF the first transistor;

a second control bus for turning ON and OFF the second transistor;

a third control bus for turning ON and OFF the third transistor; and a fourth control bus for turning ON and OFF the fourth transistor.

43. The apparatus of claim 41 wherein the control bus network further comprises:

a first control bus for turning ON and OFF the first and second transistors; and a second control bus for turning ON and OFF the third and fourth transistors.

44. The circuit of claim 41, further comprising:

a first voltage and a second voltage, wherein the first voltage is greater than the second voltage by more than the threshold programming voltage;

means for applying one of the first and second voltages to the first voltage supply bus;

means for applying the other of the first and second voltages to the second voltage supply bus; and means for operating the control bus network to turn ON either the first and second programming transistors to program the first anti-fuse device or to turn ON the third and fourth programming transistors to program the second anti-fuse device.

45. The circuit of claim 41, further comprising:

a plurality of anti-fuse devices connected in series to the first and second anti-fuse devices to form a string of anti-fuse devices;

a plurality of pairs of programming transistors wherein the first transistor of a pair is connected between the first voltage supply bus and the first end of an antifuse device and the second transistor of a pair is connected between the second end of the same anti-fuse device and the second voltage supply bus; and a control bus network for turning ON and OFF each programming transistor to program selectively an anti-fuse device.

46. The circuit of claim 41 wherein the control bus network further comprises a control bus line for turning ON a selected one of the first, second, third and fourth programming transistors for observing the voltage at and injecting a received voltage to the end of the anti-fuse device connected to said one ON transistor.

47. The circuit of claim 46 further comprising means for providing a voltage to the one of the first and second supply buses connected to said one ON programming transistor.

48. The circuit of claim 46 further comprising means for sensing a voltage on the one of the first and second voltage supply buses connected to said one ON programming transistor.

49. A circuit for programming an anti-fuse device comprising:

a first anti-fuse device and a second anti-fuse device each anti-fuse device having a first end and a second end and a threshold programming voltage, the first and second anti-fuse devices being connected in series at the second end of the first anti-fuse device to form a string of anti-fuse devices;

a first voltage supply bus and a second voltage supply bus;

a first programming transistor connected between the first voltage supply bus and the first end of the first anti-fuse device;

a second programming transistor connected between the second voltage supply bus and the second end of the first anti-fuse device;

a third programming transistor connected between the first voltage supply bus and the second end of the second anti-fuse device; and a control bus network for turning the first, second and third programming transistors ON and OFF to program selectively one of the first and second anti-fuse devices.

50. The apparatus of claim 49 wherein the control bus network further comprises:

a first control bus for turning ON and OFF the first programming transistor;

a second control bus for turning ON and OFF the second programming transistor; and a third control bus for turning ON and OFF the third programming transistor.

51. The circuit of claim 49, further comprising:

a first voltage and a second voltage, wherein the first voltage is greater than the second voltage by more than the threshold programming voltage;

means for applying one of the first and second voltages to the first voltage supply bus;

means for applying the other one of the first and second voltages to the second voltage supply bus; and means for operating the control bus network to turn ON either the first and second programming transistors to program the first anti-fuse device or to turn ON the second and third programming transistors to program the second anti-fuse device.

52. The circuit of claim 49, further comprising:

a third anti-fuse device and a fourth anti-fuse device, each anti-fuse device having a first end and a second end and a threshold programming voltage, the first end of the fourth anti-fuse device being connected in series with the second end of the third anti-fuse device to form a string of anti-fuse devices;

a third voltage supply bus and a fourth voltage supply bus;

a fourth programming transistor connected between the third voltage supply bus and the first end of the third anti-fuse device;

a fifth programming transistor connected between the fourth voltage supply bus and the second end of the third anti-fuse device;

a sixth programming transistor connected between the third voltage supply bus and the second end of the fourth anti-fuse device; and wherein the control bus network further comprises a network for turning the fourth, fifth and sixth programming transistors ON and OFF to program selectively one of the third and fourth anti-fuse devices.

53. The apparatus of claim 52 wherein the control bus network further comprises:

a first control bus for turning ON and OFF the first and fourth programming transistors;

a second control bus for turning ON and OFF the second and fifth programming transistors; and a third control bus for turning ON and OFF the third and sixth programming transistors.

54. The apparatus of claim 5 wherein the second voltage supply bus is the same as the third voltage supply bus.

55. The apparatus of claim 52 wherein the first voltage supply bus is the same as the third voltage supply bus.

56. The apparatus of claim 52, further comprising:
strings of anti-fuse devices arranged in horizontal and vertical rows across the semiconductor chip; and
diagonal anti-fuse devices connecting the horizontal and vertical anti-fuse device strings.

57. The circuit of claim 49 wherein the control bus network further comprises a control bus line for turning ON a selected one of the first, second, third, fourth, fifth and sixth programming transistors for observing the voltage at and injecting a received voltage to the end of the anti-fuse device connected to said one ON transistor.

58. The circuit of claim 57 further comprising means for providing a voltage to the one of the first, second, third and fourth supply buses connected to said one ON programming transistor.

59. The circuit of claim 57 further comprising means for sensing a voltage on the one of the first, second, third and fourth voltage supply buses connected to said one ON programming transistor 60. A programmable interconnection architecture for use in a semiconductor chip for programming a targeted anti-fuse device, comprising:
a plurality of anti-fuse devices connected to each other in series to form a plurality of strings, each anti-fuse device having a first end and a second end and the ends of each string having an open circuit condition;
a plurality of programming transistors arranged in pairs of first and second programming transistors such that each first end of an anti-fuse device is connected to one first programming transistor and each second end of an antifuse device is connected to a second programming transistor;
a plurality of voltage supply buses connected to the plurality of programming transistors such that each antifuse device is connected between one first programming transistor and second programming transistor, wherein the one first and second programming transistors are connected to different voltage supply buses; and
a control bus network for turning ON and OFF each of the plurality of programming transistors.

61. The apparatus of claim 60 wherein the control bus network further comprises:
a plurality of control buses, wherein each control bus is connected to the gate input of at least one programming transistor of the pair of programming transistors associated with one anti-fuse device, and wherein two control buses must be turned ON to program an anti-fuse device.

62. The apparatus of claim 61 further comprising means for operating the plurality of control buses for selectively turning ON one of said plurality of programming transistors for observing the voltage at or injecting a voltage to the end of the anti-fuse device to which the one ON programming transistor is connected.

63. In a circuit for programming an anti-fuse device connected in an interconnection architecture comprised of strings of anti-fuse devices wherein each string comprises a plurality of anti-fuse devices connected in series, and wherein each anti-fuse device has a first and second end and a threshold programming voltage, and wherein each anti-fuse device has an associated pair of programming transistors comprising a first and a second transistor respectively connected to the first and second ends of the anti-fuse device, and wherein a first voltage supply bus for receiving a first voltage is connected to the first transistor and a second voltage supply bus for receiving a second voltage is connected to the second transistor of each pair of transistors in a string, and wherein a control bus network is connected to the transistors for turning them ON and OFF, a method of programming a selected anti-fuse device comprising the steps of:
supplying a predetermined first voltage to a selected first voltage supply bus;
supplying a predetermined second voltage to a selected second voltage supply bus, the difference between the first and second predetermined voltages being larger than the threshold programming voltage; and
turning ON a selected pair of programming transistors to program the selected anti-fuse device.

64. The method of claim 63, further comprising programming a diagonal anti-fuse device by using one horizontal voltage supply bus, one vertical voltage supply bus and the two control buses adjacent to it.

65. The method of claim 63 further comprising programming simultaneously more than one anti-fuse device connected in series wherein turning ON the pair of programming transistors further comprises selecting a first transistor connected between the first voltage supply bus and one end of said more than one series anti-fuse devices, selecting a second transistor connected between the second voltage supply bus and the other end of said more than one series anti-fuse devices, and turning ON the ,selected first and second transistors, and wherein supplying the first and second predetermined voltages further comprises providing difference between the first and second predetermined voltages that is sufficient to program said more than one anti-fuse devices.

66. The method of claim 63 in which there is at least one string of anti-fuse devices wherein supplying the first predetermined voltage further comprises supplying the first predetermined voltage to each programming transistor connected to the first end of each anti-fuse devices in the string, and supplying the second predetermined voltage to each programming transistor connected to the second end of each anti-fuse device in the string.

67. The method of claim 66 wherein turning ON the selected pair of programming transistors further comprises connecting the selected pair of transistors to one control bus and raising the one control bus.

68. The method of claim 66 wherein turning ON the selected pair of programming transistors further comprises separately turning ON the pair of programming transistors contemporaneously.

69. The method of claim 66 in which there is a second string of anti-fuse devices in parallel with the one string such that turning ON the selected pair of the programming transistors on the one string also turns ON the corresponding pair of programming transistors in the second string, further comprising:
supplying third and fourth predetermined voltages to the corresponding first and second voltage supply buses for the second string, the differences between the third and fourth voltages being less than the threshold programming voltage.

70. The method of claim 69 wherein the second selected voltage supply bus of the one string and the first selected voltage supply bus of the second string are one voltage supply bus and the second and third predetermined voltages are the same.

71. The method of claim 70 wherein the second, third and fourth predetermined voltages are the same voltage.

72. The method of claim 63 in which the interconnection architecture includes an anti-fuse device connecting a first point in one series string of anti-fuse devices to a second point in another series string of anti-fuse devices further comprising:
- selecting the first transistor to be a transistor associated with the one series string connected between a voltage supply bus and the one first point;
- selecting the second transistor to be a transistor associated with the other series string connected between a voltage supply bus and the second point;
- wherein the selected first voltage supply bus is the voltage supply bus connected to the first transistor and the selected second voltage supply bus is connected to the second transistor; and
- turning ON the selected pair of programming transistors further comprises turning ON the selected first and second transistors, thereby programming the anti-fuse device between the first and second points.

73. The method of claim 72 further comprising turning the selected first and second transistors ON using separate control buses.

74. The method of claim 63 wherein turning ON the selected pair of programming transistors further comprises turning ON one or more programming transistors of other anti-fuse devices that are not to be programmed, and supplying a voltage difference across said other anti-fuse devices that is less than the threshold programming voltage.

75. The method of claim 74 wherein turning ON one or more other programming transistors further comprises connecting said other programming transistors to the same control buses that turn ON the selected pair of programming transistors.

76. The method of claim 75 wherein the other anti-fuse devices are in a different string of anti-fuse devices than the anti-fuse devices to be programmed.

77. The method of claim 63 wherein supplying the first and second predetermined voltages to the selected pair of programming transistors further comprises supplying one of the first and second predetermined voltages to one end of another anti-fuse device that is not to be programmed, the method further comprising supplying the same voltage to the other end of said other anti-fuse device so that the difference in voltages across said other anti-fuse device is less than the threshold programming level.

78. The method of claim 77 wherein supplying said one of the first and second predetermined voltages to one end of another anti-fuse device further comprising connecting said one end to the same selected voltage supply bus.

79. The method of claim 78 wherein the other anti-fuse device is in a different series string of anti-fuse devices from the anti-fuse device to be programmed.

80. The method of claim 63 further comprising:
- turning ON one of the selected pair of programming transistors; and
- observing the voltage at the end of the selected anti-fuse device on the voltage supply bus connected to said end by said one ON programming transistor.

81. The method of claim 63 further comprising:
- injecting a voltage to one end of a first selected anti-fuse device by turning ON one of the selected pair of programming transistors for said first anti-fuse device and applying a voltage on the one of the first and second voltage supply buses connected to said one ON programming transistor.

82. The method of claim 81 further comprising:
- observing the voltage at one end of a second selected anti-fuse device in response to a voltage injected at a first selected anti-fuse device by turning ON one of the selected pair of programming transistors for said second anti-fuse device and observing the voltage on the one of the first and second voltage supply buses connected to said ON programming transistor for the second selected anti-fuse device.

83. A method of programming one anti-fuse device in a string of anti-fuse devices in which each anti-fuse device has a pair of programming transistors connecting the anti-fuse device between two voltage supply buses comprising:
- (a) applying a first voltage to a first voltage supply bus;
- (b) applying a second voltage to a second voltage supply bus;
- (c) turning ON the pair of programming transistors connecting the one anti-fuse device between the first and second supply buses, thereby to apply the difference between the first and second voltages across the anti-fuse device; and
- (d) maintaining at least one programming transistor of each of the other pairs of programming transistors OFF so that no significant differential voltage is applied to the other anti-fuse devices of the string.

84. The method of claim 83 further comprising maintaining OFF both programming transistors associated with each other anti-fuse device during programming of the one anti-fuse device.

85. The method of claim 84 further comprising programming a second anti-fuse device in said string following steps (a), (b), (c), and (d).

86. The method of claim 85 wherein programming the second anti-fuse device further comprises selecting the magnitude and duration of the difference voltage applied to the second anti-fuse device to be different than the magnitude and duration of the different voltage applied to the one anti-fuse device.

87. A method for programming anti-fuse devices having a first end, a second end and a threshold programming voltage comprising:
- connecting the first end of the anti-fuse device to a first transistor;
- connecting the second end of the anti-fuse device to a second transistor;
- connecting the first transistor to a first voltage supply bus;
- connecting the second transistor to a second voltage supply bus;
- turning ON the first and second transistors; and
- applying a first voltage and a second voltage across the anti-fuse device such that the difference between the first and second voltages is greater than the threshold programming voltage.

88. The method of claim 87 wherein turning the first and second transistors ON further comprises:
- connecting the first and second transistors to a common control bus and raising the common control bus to turn ON the first and second transistors.

89. The method of claim 87 wherein turning the first and second transistors ON further comprises:
connecting the first and second transistors to respective first and second control buses and raising the first and second control buses contemporaneously.

90. The method of claim 89 further comprising selecting the magnitude and duration of the applied difference voltage to select the impedance of the programmed anti-fuse device.

91. A circuit for programming an anti-fuse device comprising:
a first, second, and third anti-fuse devices, each having a first end, a second end, and a threshold programming voltage, the third anti-fuse device being connected between the second end of the first anti-fuse device and the first end of the second anti-fuse device;
a first voltage supply bus for receiving a first voltage, a second voltage supply bus for receiving a second voltage, a third voltage supply bus for receiving a third voltage, and a fourth voltage supply bus for receiving a fourth voltage;
a first transistor having an ON and OFF condition connected between the first voltage supply bus and the first end of the first anti-fuse device;
a second transistor having an ON and OFF condition connected between the second voltage supply bus and the second end of the second transistor;
a third transistor having an ON and OFF condition connected between the third voltage supply bus and the first end of the second anti-fuse device;
a fourth transistor having an ON and OFF condition connected between the fourth voltage supply bus and the second end of the first anti-fuse device; and
a control bus network connected to the first, second, third and fourth transistors for selectively turning the same ON and OFF.

92. The apparatus of claim 91 wherein the control bus network further comprises:
a first control bus for turning ON and OFF the first transistor;
a second control bus for turning ON and OFF the second transistor;
a third control bus for turning ON and OFF the third transistor; and
a fourth control bus for turning ON and OFF the fourth transistor.

93. The apparatus of claim 91 further comprising:
a first voltage and a second voltage wherein the first voltage is greater than the second voltage by more than the threshold programming voltage;
means for applying the first and second voltages to any two of the first, second, third and fourth voltage supply buses and means for operating the control bus network to turn ON one pair of transistors connecting said two buses to the anti-fuse device between said pair of transistors.

94. The apparatus of claim 91 wherein the first anti-fuse device is one of a plurality of anti-fuse devices in a first string, the second anti-fuse device is one of a plurality of anti-fuse devices in a second string, and the third anti-fuse device is programmable to connect the first and second strings.

* * * * *

UNITED STATES PATENT AND TRADEMARK OFFICE
CERTIFICATE OF CORRECTION

PATENT NO. : 5,294,846

DATED : March 15, 1994

INVENTOR(S) : Paivinen

It is certified that error appears in the above—identified patent and that said Letters Patent is hereby corrected as shown below:

```
Column 4, line 66, delete "antifuse" and insert --anti-fuse--.
Column 5, line 3, delete "antifuse" and insert --anti-fuse--.
Column 5, line 51, delete "antifuse" and insert --anti-fuse--.
Column 8, line 56, delete "V" and insert --$V_1$--.
Column 8, line 57, following "would" insert --be connected to ground
   potential, and control lines 71 and--.
Column 8, line 67, delete "V" and insert --$V_1$--.
Column 9, line 36, delete "antifuse" and insert --anti-fuse--.
Column 10, line 57, delete "antifuse" and insert --anti-fuse--.
Column 15, line 25, delete "antifuse" and insert --anti-fuse--.
Claim 8, column 14, line 50, delete "monitor" and insert --detector--.
Claim 13, column 15, line 40, delete ";" and insert --:--.
Claim 20, column 16, line 10, delete "antifuse" and insert --anti-fuse--.
Claim 22, column 16, line 29, delete "antifuse" and insert --anti-fuse--.
Claim 45, column 19, line 35, delete "antifuse" and insert --anti-fuse--.
Claim 54, column 20, line 66, delete "5" and insert --52--.
```

UNITED STATES PATENT AND TRADEMARK OFFICE
CERTIFICATE OF CORRECTION

PATENT NO. : 5,294,846
DATED : March 15, 1994
INVENTOR(S) : Paivinen

Page 2 of 2

It is certified that error appears in the above-indentified patent and that said Letters Patent is hereby corrected as shown below:

Claim 60, column 21, line 40, delete "antifuse" and insert --anti-fuse--.

Signed and Sealed this

Twenty-sixth Day of September, 1995

Attest:

BRUCE LEHMAN

Attesting Officer

Commissioner of Patents and Trademarks